United States Patent [19]
Sato et al.

[11] Patent Number: 5,972,561
[45] Date of Patent: Oct. 26, 1999

[54] METHOD FOR PRODUCING PHOTOSENSITIVE PRINTING PLATE

[75] Inventors: Katsumi Sato; Yuji Asakura, both of Shizuoka, Japan

[73] Assignee: Fuji Photo Film Co., Ltd., Kanagawa, Japan

[21] Appl. No.: 09/048,784

[22] Filed: Mar. 27, 1998

[30] Foreign Application Priority Data

Mar. 28, 1997 [JP] Japan ................................. 9-077364

[51] Int. Cl.$^6$ .............................. G03F 7/115; G03F 7/16; G03F 7/09
[52] U.S. Cl. ..................... 430/273.1; 430/269; 430/950
[58] Field of Search ................ 430/950, 273.1, 430/269, 300, 306

[56] References Cited

U.S. PATENT DOCUMENTS

| 4,216,289 | 8/1980 | Oda et al. ................... 430/302 |
| 4,292,389 | 9/1981 | Kojima et al. ................ 430/169 |

FOREIGN PATENT DOCUMENTS

| 51-111102 | 10/1976 | Japan ..................... B41C 1/00 |
| 63-075753 | 4/1988 | Japan . |
| 1495361 | 12/1977 | United Kingdom . |

OTHER PUBLICATIONS

Akira et al. Accession No. 88–075753, File JAPIO, English Abstract of JP 63–075753 Published Apr. 6, 1988.

*Primary Examiner*—Janet Baxter
*Assistant Examiner*—Sin J. Lee
*Attorney, Agent, or Firm*—Sughrue, Mion, Zinn, Macpeak & Seas, PLLC

[57] ABSTRACT

The quantity of the matting agent which is applied on a portion of the moving web of continuous photosensitive printing plate to be wound in an inner half of a roll is between 1.1 and 2.0 times as much as the quantity of the matting agent which is applied on a portion of the web to be wound in an outer half of the roll. Thereby, the mat layer is formed thick on the portion of the web to be wound in the inner part of the roll. Thus, the mat layer can withstand the pressure which is generated at the inner part, and it is possible to prevent the mat layer from being flattened during the winding.

11 Claims, 3 Drawing Sheets

F I G. 1
F I G. 2
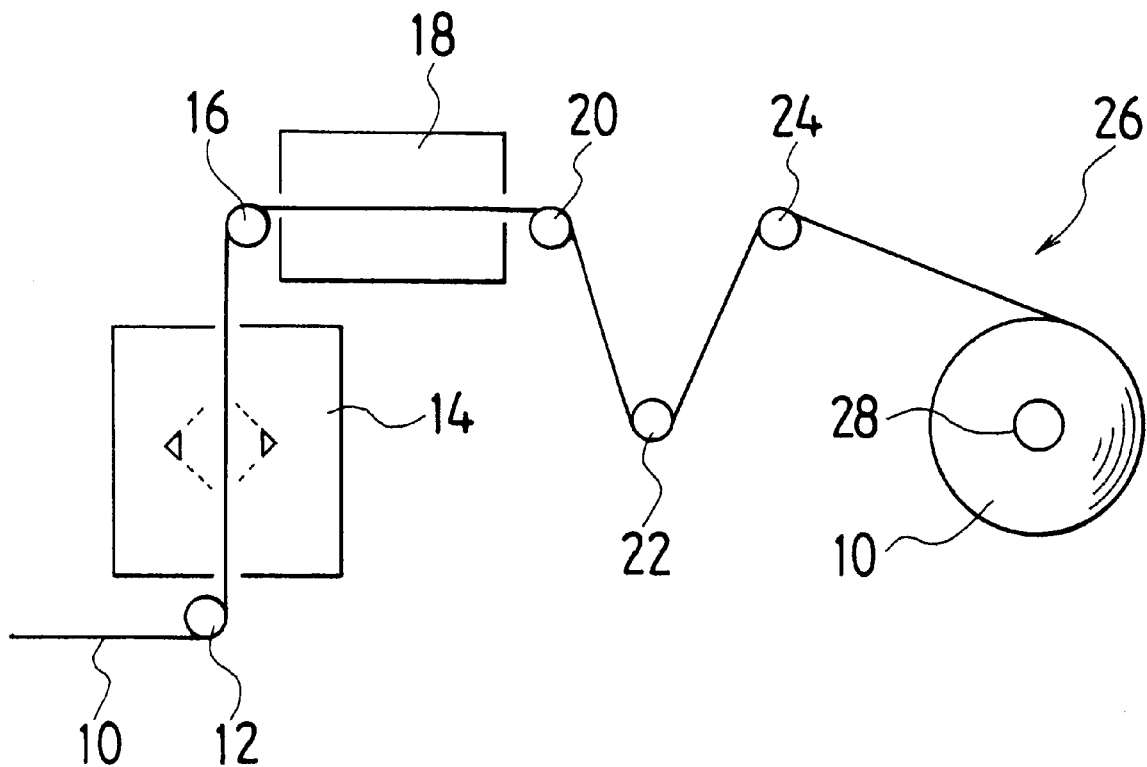
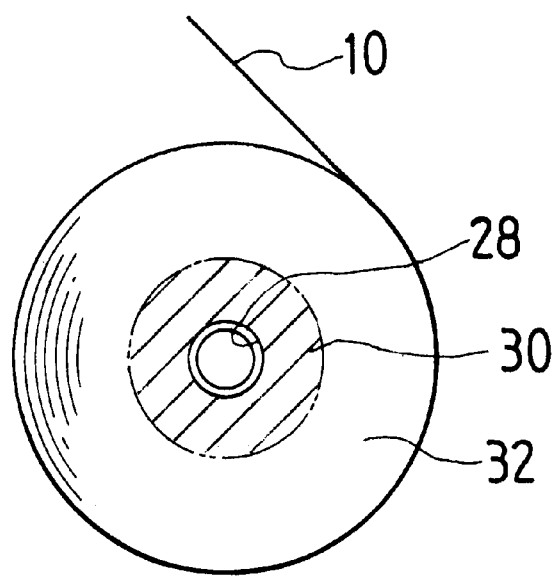

METHOD FOR PRODUCING PHOTOSENSITIVE PRINTING PLATE

BACKGROUND OF THE INVENTION

1. Field of the Invention

The present invention relates to a method for producing a photosensitive printing plate, and more particularly to a method for producing a photosensitive printing plate including steps of applying matting agent on the surface of the moving continuous photosensitive printing plate and winding the continuous photosensitive printing plate into a roll.

2. Description of Related Art

In a conventional method for producing a photosensitive printing plate, a photopolymerizing mixture, which is composed of a chemical compound including an ethylene type double bond which can addition-polymerize, a photopolymerization starting agent, an organic high molecular compound, and a thermal-polymerization prohibiting agent, is applied on a metal support such as an aluminum plate. The photosensitive printing plate is covered with a film of a desired original image and is exposed, and thereby, the photopolymerizing mixture of exposed areas polymerizes and hardens. Then, the photopolymerzing mixture of unexposed areas is dissolved and removed. Thus, a hardened relief image is formed on the printing plate.

On the other hand, Japanese Patent Provisional Publication No. 51-111102 discloses a photosensitive printing plate on which matting agent is applied such that fine unevenness patterns are formed on the surface of the photosensitive printing plate, thereby improving efficiency of the vacuum adhesion of the film of the original image onto the surface of the photosensitive printing plate. The matting agent is applied on the moving continuous photosensitive printing plate (hereinafter referred to as web), which is wound into rolls by a winding apparatus.

In the conventional method for producing the photosensitive printing plate, however, in the roll of the wound web, pressure excessively increases on a part of the web which is wound in the inner part (the vicinity of the core) of the roll during the winding, and thereby, the surface of the mat layer formed on the web of the inner part is flattened.

If the surface of the mat layer is flattened, the efficiency deteriorates of the vacuum adhesion of the original film onto the surface of the photosensitive printing plate. Moreover, the pressure applied on the web which is wound in the inner part of the roll is absorbed by the flattening of the mat layer, and a gap is produced between turns of the web due to gravitation. Then, the gap moves to the outer part of the roll during the winding, and thereby a winding disorder occurs.

SUMMARY OF THE INVENTION

The present invention has been developed in view of the above-described circumstances, has as its object the provision of a method for producing a photosensitive printing plate which prevents the mat layer formed on the photosensitive printing plate from being flattened during the winding of the continuous photosensitive printing plate.

To achieve the above-mentioned object, a method for producing a photosensitive printing plate of the present invention comprises the steps of: applying matting agent on a surface of a moving web of continuous photosensitive printing plate, and winding the web into a roll by a winding apparatus; and is characterized in that the quantity of the matting agent which is applied on a leading portion of the web is set larger than the quantity of the matting agent which is applied on a trailing portion of the web.

According to the present invention, the quantity of the matting agent which is applied on the leading portion of the web is larger than the quantity of the matting agent which is applied on the trailing portion of the web. Thereby, the mat layer formed on the web is prevented from being flattened during the winding of the web.

Moreover, to achieve the above-mentioned object, a method for producing a photosensitive printing plate of the present invention comprises the steps of: applying matting agent on a surface of a moving web of continuous photosensitive printing plate, and winding the web into a roll by a winding apparatus; and is characterized in that the quantity of the matting agent which is applied on a portion of the web from a leading end to nearly a half point of the roll is set at between 1.1 and 2.0 times as large as the quantity of the matting agent which is applied on the other portion of the web.

According to the present invention, the quantity of the matting agent which is applied on the portion of the web from the leading end to nearly the half point of the roll, that is, the length to be wound in the inner part of the roll is set at between 1.1 and 2.0 times as large as the quantity of the matting agent which is applied on the other portion of the web. Since the mat layer is formed thick on the inner part of the roll, the mat layer can withstand the pressure which is generated at the inner part. Thus, it is possible to prevent the mat layer from being flattened during the winding.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a view of assistance in explaining a winding apparatus which includes a matting agent applying apparatus to which the present invention is applied;

FIG. 2 is a side view illustrating a roll of a continuous photosensitive printing plate which is wound on a core;

DETAILED DESCRIPTION OF THE PREFERRED EMBODIMENT

Figure 3:
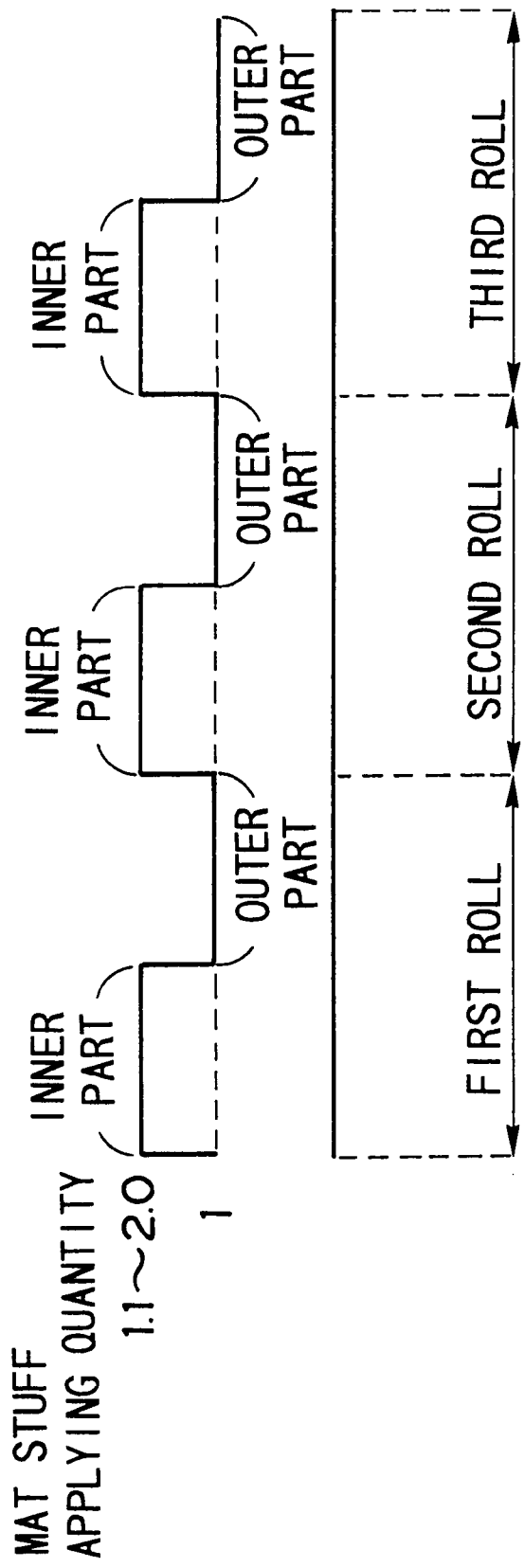
FIG. 3 is a timing chart showing the control of the applying quantity of the matting agent with respect to the length of the continuous photosensitive printing plate.

This invention will be described in further detail by way of example with reference to the accompanying drawings.

FIG. 1 is a view of assistance in explaining a winding apparatus including a matting agent applying apparatus to which the present invention is applied.

As shown in FIG. 1, a continuous photosensitive printing plate (hereinafter referred to as web) 10 is horizontally transported to a roller 12, and the web 10 is vertically turned by the roller 12. Then, the web 10 is transported to the matting agent applying apparatus 14. When the web 10 passes through the matting agent applying apparatus 14, matting agent is applied onto both surfaces of the web 10. After passing the matting agent applying apparatus 14, the web 10 is horizontally turned by the roller 16. Then, the web 10 is transported to a dryer 18, which dries the web 10, and the web 10 is wound on a core 28 into a roll by a winding apparatus 26 via rollers 20, 22, 24.

FIG. 2 is a side view illustrating a roll of the web 10 wound on the core 28. In this embodiment, the quantity of the matting agent which is applied on a length of the web 10 to be wound in an inner part 30 (the vicinity of the core 28, the inside of a circle represented with an alternate long and two short dashes line in the drawing) of the roll, is between 1.1 and 2.0 times as large as the quantity of the matting agent which is applied on a length of the web 10 to be wound in an outer part 32 (the outside of the circle represented with the alternate long and two short dashes line in the drawing) of the roll.

FIG. 3 is a timing chart about the control of the applying quantity of the matting agent with respect to the length of the web 10 to be wound into rolls. In this embodiment, for a length of the web 10 to be wound into a roll, the quantity of the matting agent which is applied on a portion of the web 10 from a leading end to nearly the half point (the length to be wound in the inner part 30 of the roll) is between 1.1 and 2.0 times as large as the quantity of the matting agent which is applied on the other portion of the web 10 (the length to be wound in the outer part 32 of the roll).

EXAMPLE

1. The Mat Layer Forming

An aluminum web (0.3 mm thick, 816 mm wide, and 6,300 m along) was previously surface-treated and coated with a photosensitive layer. A mat layer forming resin was applied onto the surface of the photosensitive layer on the web in the following conditions, and the web was dried for approximately five seconds by the dry air at 90° C.

Mat Layer Forming Conditions a) The mat layer forming resin applying method: rotary atomization electrostatic applying machine.
b) The revolution rate of the atomization head in the rotary atomization electrostatic applying machine: 14,000 rpm
c) The applied voltage of the atomization head in the rotary atomization electrostatic applying machine: −83 kV
d) The density of the mat layer forming resin solution: 16%
e) The flow rate of the mat layer forming resin solution: 120 cm$^3$/min
f) The temperature and humidity of the environment during applying: 32° C.,52% RH
g) The distance between the atomization head and the web: 630 mm
h) The quantity of the mat layer forming resin applied on the web: 0.21 g/m$^2$
i) The transporting speed of the web: 92 m/min Conventional conditions for applying the mat layer forming resin will be described below for comparison.

Conventional Mat Layer Forming Conditions a) The mat layer forming resin applying method: rotary atomization electrostatic applying machine.
b) The revolution rate of the atomization head in the rotary atomization electrostatic applying machine: 23,000 rpm
c) The applied voltage of the atomization head in the rotary atomization electrostatic applying machine: −83 kV
d) The density of the mat layer forming resin solution: 13%
e) The flow rate of the mat layer forming resin solution: 92 cm$^3$/min
f) The temperature and humidity of the environment during applying: 32° C., 52% RH
g) The distance between the atomization head and the web: 630 mm
h) The quantity of the mat layer forming resin applied on the web: 0.12 g/m$^2$
i) The transporting speed of the web: 92 m/min 2. The Items of Evaluation of Performance a) The vacuum adhesion time The evaluation method: In a printer, a film of an original image (505×610 mm) was placed at the center of the produced photosensitive printing plate (1000×700 mm), and the time required for completing the vacuum adhesion of the film onto the photosensitive printing plate was measured.

The evaluation standard: The reduction in the vacuum adhesion time in comparison with the conventional product was evaluated.

b) The winding disorder

The evaluation method: A winding of the web was temporarily stopped when approximately ⅓ of a roll had been wound, and a line was described on the side of the roll radially from the core. Then, the winding was resumed, and it was evaluated whether there was any disorder of the line after the winding of the roll was completed.

The evaluation standard: The occurrence rate of disorder of the line (the number of disorder occurrence rolls / the number of the produced rolls×100%) was compared with the conventional product.

c) The contamination in the printing press

The evaluation method: The quantity of exfoliative particles of the applied mat layer forming resin on both surfaces of the produced photosensitive printing plate was measured as follows.

Figure 4:
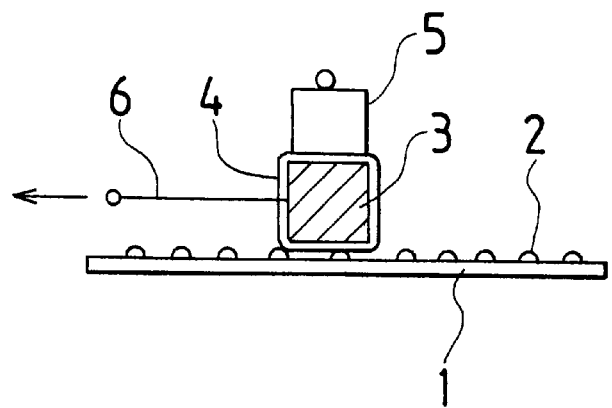
FIG. 4 is a view of assistance for explaining a method of evaluating the contamination in a printing press.

The measurement method: As shown in FIG. 4, a cloth 4 was wound around a sponge 3 (in which an area contacting the photosensitive printing plate 1 is 150×65 mm), and a weight 5 (1.35 kg) was placed on the sponge 3. The sponge 3 was pulled by a string 6. Exfoliative particles of the applied mat layer forming resin 2 were wiped up with the cloth 4 from each area of 1 m$^2$ of each surface of the photosensitive printing plate 1. Then, the cloth 4 was soaked in the predetermined quantity of water, and was ultrasonically cleaned. The absorbancy of the water was measured in the wavelength of the color of the mat layer forming resin with an absorptiometer. The quantity of the particles of the mat layer forming resin which adhered to the cloth 4 was determined with a calibration curve which represented the relations between the absorbancy and the density of the mat layer forming resin in the water.

The evaluation standard: The quantity of the exfoliated particles of the applied mat layer forming resin was compared with the conventional product.

d) The adhesion with the reverse surface

Figure 5:
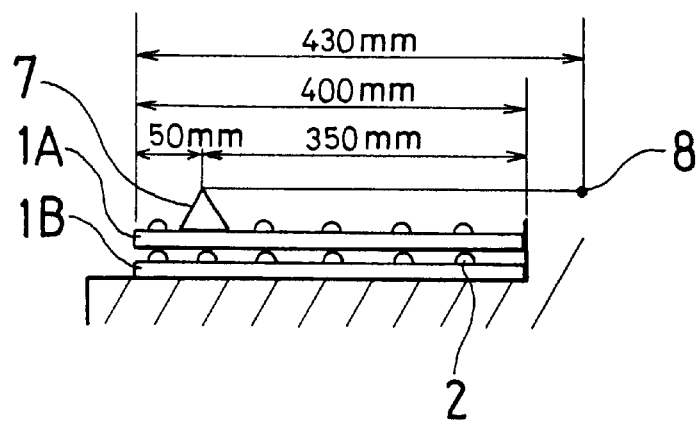
FIG. 5 is a view of assistance for explaining a method of evaluating the adhesion with the reverse surface.
Figure 6:
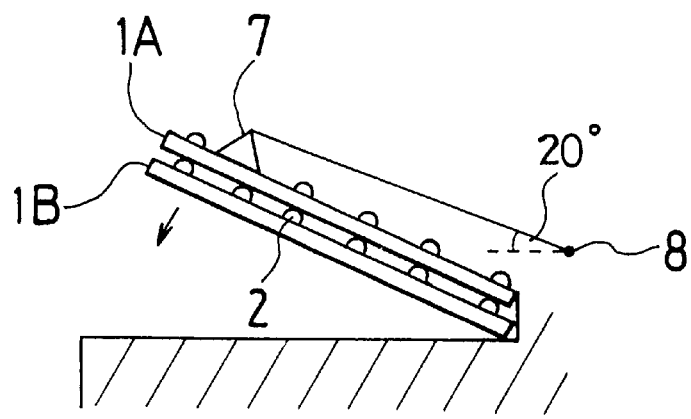
FIG. 6 is a view of assistance for explaining a method of evaluating the adhesion with the reverse surface.

The evaluation method: As shown in FIG. 5, two produced photosensitive printing plates 1A, 1B were stacked, and a suction cup 7 was pressed to adhere on the photosensitive printing plate 1A under preset pressure. Then, the suction cup 7 was lifted at an angle of 20° with respect to a fulcrum 8 as shown in FIG. 6. The time was measured to elapse after the suction cup 7 was lifted before the lower photosensitive printing plate 1B fell.

The evaluation standard: The measured time to elapse before the lower photosensitive printing plate fell was compared with the conventional product.

3. The Results of Evaluation

TABLE 1 shows the results of the evaluation in the four evaluation items with respect to proportions of the quantity of the mat layer forming resin which was applied on the web wound in the inner part of the roll to the quantity of the mat layer forming resin which was applied on the web wound in the outer part of the roll.

TABLE 1

|  | Proportion | | | | | |
| --- | --- | --- | --- | --- | --- | --- |
|  | 1.1 | 1.3 | 1.5 | 1.7 | 2.0 | 2.2 |
| Vacuum adhesion time | B | A | A | A | A | A |
| Winding disorder | B | A | A | A | A | A |
| Contamination in printing press | A | A | A | A | B | C |
| Adhesion with reverse surface | A | A | A | B | B | C |

A: Improved
B: Tended to improve
C: Deteriorated

As shown in TABLE 1, when the proportion was 1.1 times as much, the contamination in the printing press and the adhesion with the reverse surface improved. The vacuum adhesion time and the winding disorder did not improve satisfactorily.

When the proportion was 1.3 and 1.5 times as much, there was an improvement in all the evaluation items. When the proportion was 1.7 times as much, the adhesion with the reverse surface did not improve satisfactorily. When the proportion was 2.0 times as much, the vacuum adhesion time and the winding disorder improved, but the contamination in the printing press and the adhesion with the reverse surface did not improve satisfactorily. When the proportion was 2.2 times as much, the contamination in the printing press and the adhesion with the reverse surface deteriorated.

In view of the above-mentioned results, the proportion of the quantity of the mat layer forming resin which was applied on the web wound in the inner part of the roll to the quantity of the mat layer forming resin which was applied on the web wound in the outer part of the roll, is favorably between 1.1 and 2.0, and more favorably between 1.3 and 1.5.

In this embodiment, the quantity of the mat layer forming resin applied on the web wound in the inner half of a roll is between 1.1 and 2.0 times as much as the quantity of the mat layer forming resin applied on the web wound in the outer half of the roll. However, the quantity of the mat layer forming resin applied on the web wound in the inner half of a roll may be decreased step-by-step or gradually from the leading end of the web to the half point.

As set forth hereinabove, according to the present invention, for a length of the web to be wound into a roll, the quantity of the matting agent which is applied on a portion of the web from a leading end to nearly the half point is between 1.1 and 2.0 times as large as the quantity of the matting agent which is applied on the other portion of the web. Thereby, it is possible to prevent the mat layer from being flattened on the winding of the web into the roll.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A method for producing a photosensitive printing plate comprising the steps of:

applying matting agent on a surface of a moving web of continuous photosensitive printing plate, and winding the web into a roll by a winding apparatus;

wherein the quantity of the matting agent which is applied on a leading portion of the web is set larger than the quantity of the matting agent which is applied on a trailing portion of the web.

2. A method for producing a photosensitive printing plate comprising the steps of:

applying matting agent on a surface of a moving web of continuous photosensitive printing plate, and winding the web into a roll by a winding apparatus;

wherein the quantity of the matting agent which is applied on a leading portion of the web is set at between 1.1 and 2.0 times as large as the quantity of the matting agent which is applied on a trailing portion of the web.

3. The method for producing the photosensitive printing plate as defined in claim 2, wherein the quantity of the matting agent which is applied on the leading portion of the web is gradually decreased from a leading end of said leading portion.

4. A method for producing a photosensitive printing plate comprising the steps of:

applying matting agent on a surface of a moving web of continuous photosensitive printing plate, and winding the web into a roll by a winding apparatus;

wherein the quantity of the matting agent which is applied on a leading portion of the web is set at between 1.3 and 1.5 times as large as the quantity of the matting agent which is applied on a trailing portion of the web.

5. The method for producing the photosensitive printing plate as defined in claim 4, wherein the quantity of the matting agent which is applied on the leading portion of the web is gradually decreased from a leading end of said leading portion.

6. A method for producing a photosensitive printing plate comprising the steps of:

applying matting agent on a surface of a moving web of continuous photosensitive printing plate, and winding the web into a roll by a winding apparatus, wherein the quantity of the matting agent which is applied on a first half of said web is set at between 1.1 and 2.0 times the quantity of the matting agent which is applied on a second half of said web.

7. A method for producing the photosensitive printing plate as defined in claim 6, wherein the quantity of the matting agent which is applied on said first half of said web is gradually decreased from a leading end of said first half of said web to said second half of said web.

8. A method for producing a photosensitive printing plate comprising the steps of:

applying matting agent on a surface of a moving web of continuous photosensitive printing plate, and winding the web into a roll by a winding apparatus, wherein the quantity of the matting agent which is applied on a first half of said web is set at between 1.3 and 1.5 times the quantity of the matting agent which is applied on a second half of said web.

9. A method for producing a photosensitive printing plate as claimed in claim 1, wherein said leading portion comprises not more than a half of a length of web wound about a core to form said roll.

10. A method for producing a photosensitive printing plate as claimed in claim 9, wherein the quantity of the matting agent which is applied on said leading portion of the web is set at between 1.1 and 2.0 times the quantity of the matting agent which is applied on said trailing portion of the web.

11. A method for producing a photosensitive printing plate as claimed in claim 9, wherein the quantity of the matting agent which is applied on said leading portion of the web is set at between 1.3 and 1.5 times the quantity of the matting agent which is applied on said trailing portion of the web.

* * * * *